INVENTOR.
JOHANN G. DILL,
BY
Walter J. Adam
ATTORNEY

INVENTOR.
JOHANN G. DILL,
BY

Walter J. Adam
ATTORNEY

United States Patent Office 3,126,489

Patented Mar. 24, 1964

3,126,489

PULSE FORMING CIRCUIT UTILIZING TRANSISTOR AVALANCHE CHARACTERISTICS

Johann G. Dill, Costa Mesa, Calif., assignor to Hughes Aircraft Company, Culver City, Calif., a corporation of Delaware Filed June 21, 1960, Ser. No. 37,610
4 Claims. (Cl. 307—88.5)

This invention relates to pulse generators and particularly to a pulse forming circuit utilizing transistors having avalanche characteristics to form pulses of a selected width and polarity.

Circuits for developing pulses with variable widths generally require a pluarilty of elements including a feedback arrangement. When means are required to allow selection of both the pulse width and the polarity of the pulses, the pulse forming circuits are especially complex. Further, conventional pulse forming circuits do not have sufficiently fast response characteristics because of inductive elements and the slow response of transistors, to reliably develop very narrow pulses such as pulses having a width of 1 to 2 millimicroseconds. Thus, a simplified circuit that develops very narrow pulses of a selective width and polarity would be very useful to the art.

Avalanche transistors operating in the avalanche mode, which is operation in a negative resistance region resulting from avalanche multiplication properties of the transistor, characteristically have a fast response because of the high intensity field maintained at a biased junction in the transistor. However, avalanche transistors conventionally develop a relatively wide pulse because a storage means such as a capacitor coupled in the load current path must be discharged before the pulse is terminated.

It is, therefore, an object of this invention to provide a pulse forming circuit that develops very narrow pulses of a selective width.

It is a further object of this invention to provide a simplified pulse forming circuit that utilizes the fast response characteristics of avalanche transistors to develop narrow pulses having a short rise and fall time.

It is a still further object of this invention to provide a pulse generating circuit responding to a first and a second trigger signal having a relative time relation that determines the width and polarity of the output pulses.

It is another object of this invention to provide a pulse generating circuit that responds to trigger signals applied to a single terminal to develop a very narrow pulse.

The pulse generating circuit in accordance with this invention includes first and second avalanche transistors biased in the avalanche multiplication region with their base to emitter junctions reverse biased. Trigger pulses are applied through variable delay means to the bases of the transistors to initiate the avalanche breakdown operation. First and second storage capacitors are coupled from the load paths of the respective first and second transistors to ground through a load impedance. In response to the trigger signals, the transistors form current pulses having opposite directions of flow through the load impedance, which pulses cancel except during the period between application of the two trigger pulses. Narrow output pulses are thus formed having a polarity determined by the relative order of triggering of the transistors and having a width determined by the time delay between the trigger pulses. In a second arrangement, the circuit in accordance with this invention also responds to a trigger signal applied to only one of the transistors to develop narrow output pulses.

The novel features of this invention, as well as the invention itself, both as to its organization and method of operation, will best be understood from the accompanying description taken in connection with the accompanying drawings, in which like reference characters refer to like parts, and in which.

Figure 1:
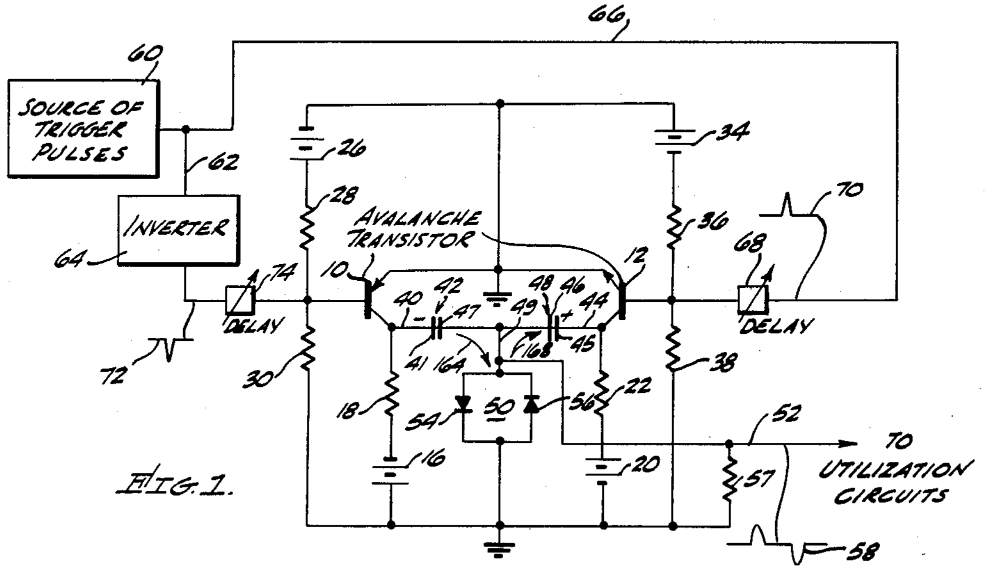
FIG. 1 is a schematic circuit diagram of one arrangement of a pulse forming circuit in accordance with this invention.

Referring first to FIG. 1, one arrangement of a pulse forming circuit in accordance with this invention will be explained. First and second avalanche transistors 10 and 12 being respectively of the p-n-p and n-p-n types are provided, with the emitters of both transistors coupled to ground. As will be explained in further detail subsequentially, the avalanche transistors 10 and 12 have a negative resistance region resulting from their avalanche multiplication properties. The collector of the transistor 10 is biased from a power source such as the negative terminal of a battery 16 through a first current limiting resistor 18 having relatively large value. The collector of the transistor 12 is biased from a power source such as the positive terminal of a battery 20 through a second current limiting resistor 22 also having a relatively large value. The respective positive and negative terminals of the batteries 16 and 20 are coupled to ground. For maintaining the transistor 10 normally nonconductive, a voltage divider arrangement is provided including a resistor 28 coupled between the positive terminal of a battery 26, having a grounded negative terminal, to the base of the transistor 10 which in turn is coupled through a resistor 30 to ground. The transistor 12 being of the opposite conductivity type has its base biased by a voltage divider arrangement including a resistor 36 coupled from the negative terminal of a battery 34 to the base of the transistor 12 which in turn is coupled through a resistor 38 to ground. The positive terminal of the battery 34 is grounded.

The collector of the transistor 10 is coupled through a lead 40 to a first plate 41 of a first charging capacitor 42, and the collector of the second transistor 12 is coupled through a lead 44 to a first plate 45 of a second charging capacitor 48. Second plates 47 and 46 of the respective capacitors 42 and 48 are coupled together and through a lead 49 to a clamping circuit 50 and to an output lead 52. The clamping circuit 50 includes first and second diodes 54 and 56 coupled in parallel with their respective anode to cathode and cathode to anode paths coupled between the lead 49 and ground for limiting the amplitude of the signals developed on the lead 49. The output lead 52 applies pulses of a waveform 58 to utilization circuits (not shown) which may include a grounded load impedance or resistor 57.

For controlling the pulse forming circuit, a source of trigger pulses 60, which pulses may be of a positive polarity, as shown by a waveform 70, are applied both through a lead 62 to an inverter circuit 64 and through a lead 66 to a variable delay means 68 which may be a tapped delay line, for example. The inverter circuit 64, as is well known in the art, inverts the positive trigger pulses of the waveform 70 to develop a negative trigger pulse of a waveform 72 which is applied to a variable delay means 74. A conventional tapped delay line may also be utilized for the delay means 74. The positive trigger pulse of the waveform 70 is applied from the delay means 68 to the base of the transistor 12, and the negative trigger pulse of the waveform 72 is applied from the delay means 74 to the base of the transistor 10. By varying the relative order in time of applying the pulses of the waveforms 70 and 72 to the bases of the transistors 12 and 10 and by varying the time between the two trigger pulses, both the polarity and width of the pulses of the waveform 58 are controlled. It is to be noted that the transistors 10 and 12 are matched as to their avalanche breakdown mechanism.

Figure 2:
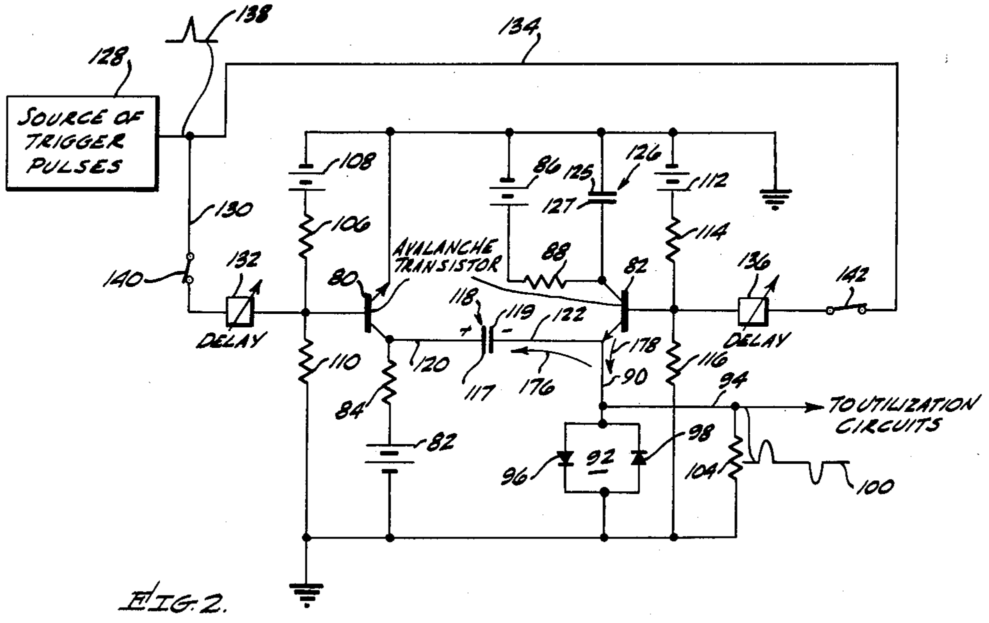
FIG. 2 is a schematic circuit diagram of another arrangement of a pulse forming circuit in accordance with this invention.

In a second arrangement of the circuit, as shown in FIG. 2, first and second avalanche transistors 80 and 82 are included, both being of the n-p-n type and having avalanche multiplication characteristics. The transistors 80 and 82 are matched as to their avalanche breakdown mechanism. The emitter of the transistor 80 is grounded, and the collector is biased in the negative resistance region relative to the emitter by a battery 82 having its negative terminal grounded and its positive terminal coupled through a first current limiting resistor 84 to the collector of the transistor 80. The transistor 82 has its collector biased relative to its emitter by a battery 86 having its negative terminal grounded and its positive terminal coupled through a second current limiting resistor 88 to the collector of the transistor 82. The emitter of the transistor 82 is coupled to a lead 90 which in turn is coupled to ground through a clamping circuit 92. The emitter of the transistor 82 is also coupled to an output lead 94. The clamping circuit 92 includes first and second diodes 96 and 98 arranged in parallel with respective anode to cathode and cathode to anode paths coupled between the lead 90 and ground. The output lead 94 applies an output pulse of a waveform 100 to utilization circuits (not shown) which may include a load impedance or resistor 104 coupled to ground.

The transistor 80 is normally reverse biased at its base relative to its emitter by a voltage divider arrangement including a resistor 106 coupled from the positive terminal of a battery 108, the negative terminal thereof being grounded, to the base of the transistor 80, which in turn is coupled through a resistor 110 to ground. The transistor 82 also has its base normally reverse biased relative to its emitter by a voltage divider arrangement including a resistor 114 coupled from the positive terminal of a battery 112, having its negative terminal grounded, to the base of the transistor 82 which in turn is coupled through a resistor 116 to ground. A first plate 117 of a first storage capacitor 118 is coupled to the collector of the transistor 80 through a lead 120 and a second plate 119 is coupled to the emitter of the transistor 82 through a lead 122. A first plate 125 of a second capacitor 126 is coupled to ground and a second plate 127 is coupled to the collector of the transistor 82. For initiating the pulse forming operation of the circuit of FIG. 2, a source of trigger pulses 128 is coupled through a lead 130 to a variable delay means 132 as well as through a lead 134 to a variable delay means 136 and in turn to the bases of the respective transistors 80 and 82. The delay means 132 and 136 may each be a conventional tapped delay line, for example. Because the circuit of FIG. 2 also responds to a pulse applied to the base of only one of the avalanche transistors, a switch 140 is provided in the lead 130 and a switch 142 is provided in the lead 134. It is to be noted at this time that triggering with a single pulse applied to the base of the transistor 80 provides a narrow output pulse of the waveform 100 on the lead 94 while triggering with a single pulse applied to the base of the transistor 82 provides a relatively wide output pulse on the lead 94.

Figure 3:
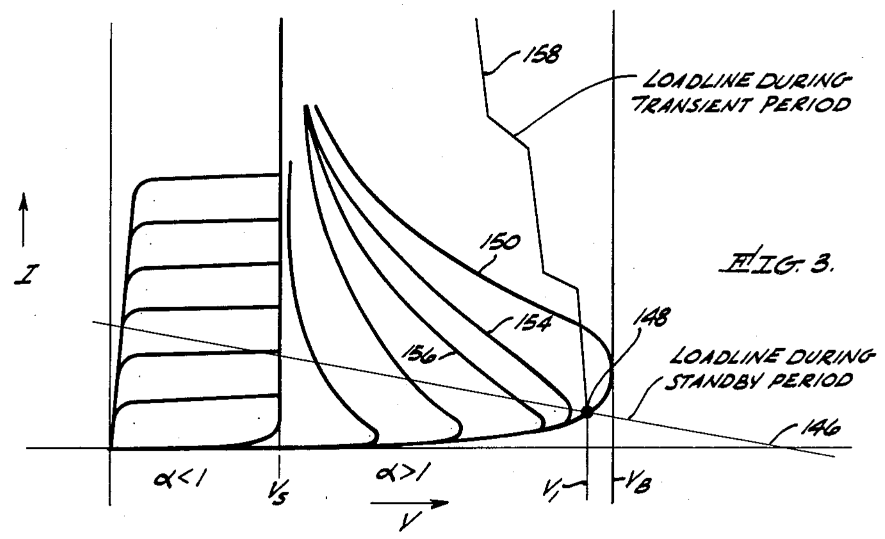
FIG. 3 is a graph of voltage versus current showing the operating characteristics of the avalanche transistors of FIGS. 1 and 2.

Referring now to FIG. 3, the operating characteristics of the avalanche transistors utilized in the circuits in accordance with this invention will be further explained. For the grounded emitter arrangement of the transistors 10 and 12 of FIG. 1 the voltage V along the X-axis of the graph of FIG. 3 represents the magnitude of the potential maintained at the collectors of the transistors 10 and 12, and the current I of the Y-axis represents the current flowing in the collectors thereof. As is well known, the operating characteristics of an avalanche transistor may include a first region where $\alpha$, which is the ratio of collector to emitter current, is less than one indicating that the current through the collector of the transistor is less than through the emitter. This first region exists for a magnitude of collector bias voltage less than $V_S$ which is the voltage at which the base current is internally compensated at the collector by an avalanche multiplication effect or current multiplication between the collector and the emitter, so that $\alpha$ equals one. When the collector is biased at a voltage having a magnitude greater than $V_S$, but less than a breakdown voltage $V_B$, which is a region of operation where $\alpha$ is greater than one, avalanche multiplication causes more current to flow through the collector of the transistor than flows through the emitter. At the breakdown voltage $V_B$ the multiplication of emitter to collector current in a p-n-p type transistor and of the collector to emitter current in an n-p-n type transistor becomes essentially infinite. The operating region between the collector voltages $V_S$ and $V_B$, because of the avalanche multiplication, is a negative resistance region.

In the avalanche multiplication operation when the emitter to the base path of the n-p-n type transistor 12 is forward biased, electrons travel from the emitter into the base region and then to the collector to base junction, which is a reverse biased junction where holes are produced. The collector to base junction is a high intensity field region because of the bias maintained between the collector and emitter and in response to the electrons produce hole-electron pairs by collision with atoms of the crystal lattice and also ionize to produce additional electrons. The holes are then swept back to the base to emitter junction and on their way free more hole-electron pairs, to provide a regenerative feedback action. The operation of the p-n-p type transistor 10 is similar except holes pass through the forward biased emitter to base junction and through the base region to the base to collector junction to form the hole-electron pairs. For the regenerative feedback operation the electrons then move back to the base emitter junction to develop other hole-electron pairs. Because of this avalanche multiplication, the current through the collectors of the transistors 10 and 12 is substantially greater than that through the respective emitters.

It is to be noted that the above avalanche multiplication operation in the transistors 10 and 12 is only initiated when the base to emitter junctions are forward biased so that holes or electrons are able to travel into the base region. Thus, a standby condition is maintained in the transistors 10 and 12 when a voltage $V_1$ is applied to the collectors thereof. A load-line 146, during the standby period, has a very small slope because the resistors 18 and 22 have a relatively large value. A standby point 148 at the voltage $V_1$ is selected at the junction of the load-line 146 and a negative resistance curve 150 of the transistors 10 and 12. The magnitude of the voltage $V_1$ is slightly less than the breakdown voltage $V_B$ so as to prevent current $MI_{co}$, which is the avalanche multiplication factor times the steady state current in the avalanche condition, from becoming infinite. The voltage $V_1$ is selected relatively close to the voltage $V_B$ so as to maintain a large potential difference between the collector and emitter of the transistors 10 and 12 which causes the area of accumulated electrons in the transistors to increase and the rate of hole-electron pair production to increase when the base to emitter junction is forward biased. The bias voltage $V_1$ is maintained at the collectors of the transistors 10 and 12 by the potential applied thereto from the batteries 16 and 20 minus the voltage drop caused by the steady state current $MI_{co}$ flowing through the respective resistors 18 and 22. The resistors 18 and 22 have a relatively large value so that the current $MI_{co}$ is maintained at a minimum value to prevent excessive power dissipation.

Now that the standby operating point 148 has been determined, the pulse forming operation in the negative resistance region will be further explained. The bias developed by the voltage dividers 28, 30 and 36, 38 at the bases of the transistors 10 and 12 maintains the transistors at the standby point 148. The voltage $V_1$ is maintained substantially constant at the collectors of the transistors 10 and 12 because an increase of $MI_{co}$ resulting, for example, from a temperature change varying the characteristics of the transistor causes the operating point to move slightly to the left which in turn provides a small increase of current multiplication in the transistor to move the operating point back to the right. Upon the application to the transistors 10 and 12 of trigger pulses of respective waveforms 72 and 70, the emitter to base junction of the transistor 10 and the base to emitter junction of the transistor 12 are forward biased. Thus, respectively holes and electrons are allowed to pass into the base region to start the regenerative feedback action. The operating points of the transistors 10 and 12 thus move from the characteristic negative resistance curve 150 along the load-line 146 to a characteristic negative resistance curve such as 154 after the avalanche breakdown and multiplication is initiated. When the trigger pulses of the waveforms 70 and 72 are removed from the bases of the transistors 10 and 12, the operation may shift to another characterstic line such as 156. The operation of the transistors after avalanche multiplication is initiated is independant of the presence of the trigger pulses of the waveforms 72 and 70. Essentially, a short circuit is present between the collectors and emitters of the transistors 10 and 12 with the avalanche multiplication resulting from the high field strength at the base to collector junction thereof causing the current in the collector to be greater than the current in the emitter by the multiplication factor M. However, substantially all of the current that flows into the collectors of the transistors 10 and 12 is obtained from the charge on the respective capacitors 42 and 48 which prevent the transistors from being destroyed.

While the capacitors 42 and 48 discharge their current through the transistors 10 and 12, the magnitudes of the voltages at the leads 40 and 44 decrease to $V_s$ and may decrease to ground potential because of the stored carriers in the base regions of the transistors. As the capacitors 42 and 48 discharge and the operation of the transistors moves along a negative resistance curve such as 154, transient load-lines similar to a load line 158 are present in the negative resistance region with the line 158 generally moving to the left as the magnitude of the voltage on the collectors decreases. When the magnitudes of the voltages on the leads 40 and 44 are below $V_s$, the transistors 10 and 12 continue to conduct current because the transistors remain forward biased between the base to emitter as a result of the internally stored carriers in that region. Thus, while the capacitors 42 and 48 are discharging, each transistor 10 or 12 forms a pulse of current flowing through the lead 49. Shortly after the capacitors 42 and 48 are completely discharged, the transistors 10 and 12 recover internally until free carriers in the base region are recombined so that the reverse biased base to emitter junctions prevent further conduction. Shortly after this time, the capacitors 42 and 48 are charged by current flowing from the batteries 16 and 20 until the voltage $V_1$ is again maintained on the leads 40 and 44 by the respective negative and positive stored charges on the plates 41 and 45 of the capacitors 42 and 48. After the transistors 10 and 12 have returned to their standby point 148 the pulsing operation may be repeated.

For further explaining the operation of the circuit of

Figure 4:
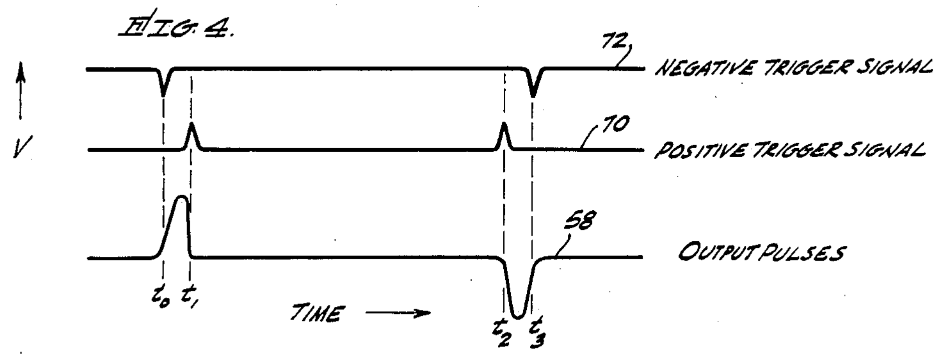
FIG. 4 is a graph of voltage versus time showing the waveforms developed in the circuits of FIGS. 1 and 2.
Figure 5:
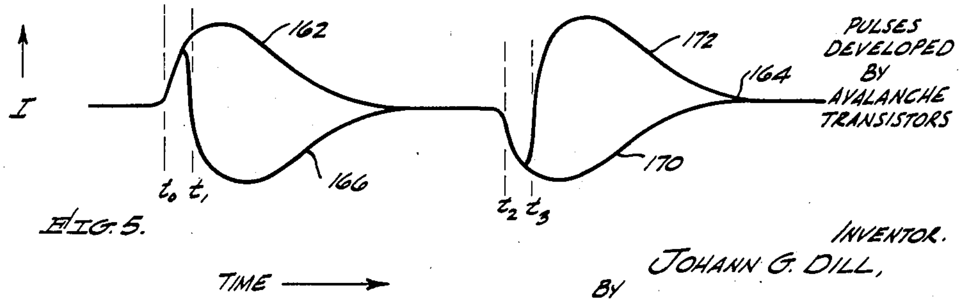
FIG. 5 is a graph of current versus time showing the current pulses developed in the circuits of FIGS. 1 and 2.

FIG. 1 to provide pulses of a selected polarity and width, reference will be made to the waveforms of FIGS. 4 and 5. In a first triggering order as determined by the variable delay means 68 and 74, the negative trigger signal of the waveform 72 is applied to the base of the transistor 10 at a time $t_0$ and the positive trigger signal of a waveform 70 is applied to the base of the transistor 12 at a time $t_1$. At the time $t_0$ the avalanche multiplication operation of the transistor 10 is initiated and a current pulse 162 of a waveform 164 is developed on the lead 49 by current flowing from the capacitor 42 through the load 57 as indicated by an arrow 164. At the time $t_1$, as the transistor 12 is initiated into the avalanche multiplication operation, a current pulse 166 is formed on the lead 49 having a direction of flow indicated by an arrow 168 as current flows to the capacitor 48 through the load resistor 57. Thus, because the transistors 10 and 12 are of opposite polarity types with their respective collectors being normally maintained with a negative and positive polarity, the current pulses 162 and 166 flow through the lead 49 in opposite directions and substantially cancel after the time $t_1$. It is only between the times $t_0$ and $t_1$ that the current pulse 162, flowing in the direction of the arrow 164, remains uncancelled to pass through the load resistance 57. Thus, a positive pulse of the waveform 58 is developed on the output lead 52 between times $t_0$ and $t_1$. It is to be noted that the clamping circuit 50 maintains the current at the peaks of the pulses 162 and 166 substantially constant. Because of the fast response time of the avalanche transistors 10 and 12 to develop a fast rise time, the positive pulse of the waveform 58 has a very steep leading and trailing edge and has a very narrow width. The time between $t_0$ and $t_1$ may be varied such as by the delay lines 68 and 74 so that positive output pulse of the waveform 58 may be selected with a desired width.

For providing output pulses of opposite polarity, the positive trigger signals of the waveform 70 are applied at a time $t_2$ to the base of the transistor 12 and the negative trigger signals of the waveform 72 are applied at a subsequent time $t_3$ to the base of the transistor 10. The transistor 12 is thus initiated into conduction at the time $t_2$ and a current pulse 170 having a direction of flow indicated by the arrow 168 flows through the lead 49. At the time $t_3$ the transistor 10 is initiated into conduction and a current pulse 172 flows through the lead 49 in a direction indicated by the arrow 164. Thus, the current pulses 170 and 172 substantially cancel except between the times $t_2$ and $t_3$ to develop a negative output pulse of the waveform 58 at the lead 52 by current flowing through the load 57 in the direction indicated by the arrow 168. Also, the time between $t_2$ and $t_3$ may be varied to provide a negative output pulse of a selected width. It is to be noted that the pulse repetition rate as controlled by the time between the times $t_1$ and $t_2$ is determined primarily by the value of the resistors 18 and 22 and the potential of the batteries 16 and 20 which may be selected to cause the collector potential of the transistors 10 and 12 to return to the standby voltage $V_1$ in a relatively short time.

When avalanche transistors having only one polarity type are available, the circuit of FIG. 2 may be utilized. The operation of the n-p-n type transistors 80 and 82 is similar to the operation of the transistor 12, as discussed above, maintaining a standby point 148 as shown in FIG. 3. The collectors of the transistors 80 and 82 are both maintained positive by the batteries 82 and 86, because the transistors 80 and 82 have similar polarity types. Positive trigger pulses of the waveform 138 are applied to the bases of both transistors to initiate the pulse forming operation thereof. When the trigger pulse of the waveform 138 is applied to the base of the transistor 82 at the time $t_0$ of FIG. 4 and is applied to the base of the transistor 80 at the time $t_1$, respective current pulses similar to 162 and 166 of FIG. 5 flow through the lead 90 in respective directions 178 and 176 to develop a positive voltage pulse as shown by the first pulse of the waveform 100. The current pulse 162 flowing in the direction of the arrow 178 flows from the capacitor 126 through the collector to emitter of the transistor 82 and through the load 104 to ground, and the current pulse 166 flowing in the direction of the arrow 176 flows from ground through the load 104 to the capacitor 118. When the trigger pulse of the waveform 138 is applied at the time $t_2$ to the transistor 80 and is applied at the time $t_3$ to the base of the transistor 82, respective current pulses similar to 170 and 172 flow through the lead 90 in directions indicated by the respective arrows 176 and 178. The current pulses similar to 170 and 172 cancel except between the times $t_2$ and $t_3$ to develop a negative voltage output pulse as shown by the waveform 100. Because a negative voltage pulse developed by the transistor 80 from the current pulse similar to 170 and applied to the emitter of the transistor 82 will initiate conduction thereof, the maximum controlled width of the negative pulse of the waveform 100 is limited by a characteristic circuit delay time determined by the capacitors 118 and 126, the load resistor 104 and the internal delay characteristics of the transistor 82. It is to be noted that when the transistor 82 is triggered before the transistor 80 the width of the positive pulse of the waveform 100 is not limited by the circuit delay characteristics because the transistor 80 characteristically does not respond to a small voltage signal applied to the collector which is biased at a relatively high potential.

When it is desired to utilize a single trigger signal in the circuit of FIG. 2, the switch 142 is opened and the trigger signal of the waveform 138 is applied to the base of the transistor 80. The transistor 80 is thus initiated into conduction and a current pulse similar to the waveform 170 is developed on the lead 90 to form a voltage pulse to initiate the transistor 82 into conduction which, in turn, develops a current pulse similar to the pulse 172. Thus, a negative output pulse of the waveform 100 is developed on the lead 94. However with this triggering arrangement, the width of the negative pulse of the waveform 100 is determined by the internal delay characteristics of the circuit as discussed above. When the switch 140 is opened and the swtich 142 is closed so as to apply the trigger pulse of the waveform 138 only to the base of the transistor 82, a wide output pulse is developed. The transistor 82 develops a current pulse having a shape similar to the pulse 162, and current flows from the capacitor 126 through the collector to emitter path of the transistor 82 in the direction indicated by the arrow 178 to form a positive voltage pulse on the lead 94 also having a shape similar to the current pulse 162. This operation to develop a relatively wide pulse results from the inability of the transistor 80 to be triggered at its collector. Although the circuit of FIG. 2 has been shown utilizing n-p-n type transistors, opposite conductivity types may be utilized in accordance with the principles of this invention, reversing the circuit polarities and the polarities of the trigger pulses.

Thus, there has been described a greatly improved pulse forming circuit for developing very narrow pulses because of the fast response time of avalanche transistors. The circuit provides pulses of a preselected width as well as of a preselected polarity. Because of the fast response of the circuit, output pulses in the range of one to two millimicroseconds may be developed. The circuit in accordance with this invention allows utilization of transistors either of the same or different polarity types. Also, the principles of this invention allow triggering either at one or two input terminals. Because of the narrow width and short rise and fall times of the pulses developed by the circuits of this invention, the principles in accordance with this invention have wide use such as in the computer field.

What is claimed is:

1. A circuit for developing an output pulse of a variable width and having a selected first or second polarity comprising first and second transistors of opposite polarity types having avalanche characteristics and each having an emitter, a collector and a base, a source of trigger pulses of a first polarity, a source of trigger pulses of a second polarity, first and second variable delay means coupled respectively from said source of trigger pulses of a first polarity and said source of trigger pulses of a second polarity to the bases of said first and second transistors, a conduction element coupled to the emitters of said first and second transistors, first and second impedance means each having one end coupled respectively to the collectors of said first and second transistors, a first and a second source of potential coupled respectively to the other end of said first and second impedance means for biasing said first and second transistors in a stable avalanche condition of operation, first and second biasing means coupled respectively to the bases of said first and second transistors for normally maintaining the emitter-base junctions thereof reverse biased, first and second capacitors each having first and second electrodes with the first electrodes coupled respectively to the collectors of said first and second transistors, third impedance means coupled from the second electrodes of said first and second capacitors to said conductive element, and output circuit means coupled to said third impedance means, said circuit developing an output pulse at said output circuit in response to said first and second transistors being biased into conduction respectively by said trigger pulses of a first and second polarity, the width of the output pulse being determined by the delay between the trigger pulses of the first and second polarity and the polarity of the output pulse being determined by the relative order of triggering said first and second transistors.

2. A pulse forming circuit comprising: first and second transistors each having avalanche multiplication characteristics and each having a current path and a control electrode, an impedance element having first and second terminals, the current path of said first transistor and a first capacitor being coupled in series between said first and second terminals, the current path of said second transistor and a second capacitor being coupled in series between said first and second terminals with the direction of avalanche breakdown current flow through the current path of said second transistor being opposite to the direction of avalanche breakdown current flow through the current path of said first transistor as measured between said first and second terminals, means for normally biasing said first and second transistors in a stable avalanche condition of operation, and means coupled to the control electrodes of said first and second transistors for triggering one of said transistors to an unstable avalanche condition during which avalanche breakdown occurs in the current path of said one transistor to provide current flow through said impedance element in a first direction and after a preselected time interval for triggering the other of said transistors to an unstable avalanche condition during which avalanche breakdown occurs in the current path of said other transistor to provide current flow through said impedance element in a second direction opposite to said first direction to substantially cancel the current flowing through said impedance element in said first direction, whereby an output pulse is provided during said preselected time interval.

3. A pulse forming circuit comprising: first and second transistors of complementary conductivity types, each having avalanche multiplication characteristics and having an emitter electrode, a base electrode, and a collector electrode; an impedance element having first and second terminals, the emitter electrodes of said first and second transistors being coupled to said first terminal; a first capacitor coupled between said second terminal and the collector electrode of said first transistor; a second capacitor coupled between said second terminal and the collector electrode of said second transistor; means for normally biasing said first and second transistors in a stable avalanche condition of operation; and means coupled to the base electrodes of said first and second transistors for triggering one of said transistors to an unstable avalanche condition during which avalanche breakdown occurs in the emitter-collector path of said one transistor to provide current flow through said impedance element in a first direction and after a preselected time interval for triggering the other of said transistors to an unstable avalanche condition during which avalanche breakdown occurs in the emitter-collector path of said other transistor to provide current flow through said impedance element in a second direction opposite to said first direction to substantially cancel the current flowing through said impedance element in said first direction, whereby an output pulse is provided during said preselected time interval.

4. A pulse forming circuit comprising: first and second transistors of the same conductivity type, each having avalanche multiplication characteristics and each having an emitter electrode, a base electrode, and a collector electrode; an impedance element having first and second terminals; the emitter electrode of said first transistor being coupled to said first terminal and the emitter electrode of said second transistor being coupled to said second terminal; a first capacitor coupled between the collector electrode of said first transistor and said second terminal; a second capacitor coupled between the collector electrode of said second transistor and said first terminal; means for normally biasing said first and second transistors in a stable avalanche condition of operation; and means coupled to the base electrodes of said first and second transistors for triggering one of said transistors to an unstable avalanche condition during which avalanche breakdown occurs in the emitter-collector path of said one transistor to provide current flow through said impedance element in a first direction and after a preselected time interval for triggering the other of said transistors to an unstable avalanche condition during which avalanche breakdown occurs in the emitter-collector path of said other transistor to provide current flow through said impedance element in a second direction opposite to said first direction to substantially cancel the current flowing through said impedance element in said first direction, whereby an output pulse is provided during said preselected time interval.

References Cited in the file of this patent

UNITED STATES PATENTS

| | | |
|---|---|---|
| 2,782,267 | Beck | Feb. 19, 1957 |
| 2,878,384 | Holmes | Mar. 17, 1959 |
| 3,031,588 | Hilsenrath | Apr. 24, 1962 |
| 3,054,907 | Payton et al. | Sept. 18, 1962 |

OTHER REFERENCES

Electronic Engineering, "Avalanche Transistors," by Macario, May 1959, pages 262–267.

UNITED STATES PATENT OFFICE

CERTIFICATE OF CORRECTION

Patent No. 3,126,489 March 24, 1964

Johann G. Dill

It is hereby certified that error appears in the above numbered patent requiring correction and that the said Letters Patent should read as corrected below.

Column 8, line 12, for "conduction" read -- conductive --.

Signed and sealed this 21st day of July 1964.

(SEAL)

Attest:

ESTON G. JOHNSON
Attesting Officer

EDWARD J. BRENNER
Commissioner of Patents